United States Patent [19]

Fujikura et al.

[11] Patent Number: 4,923,781
[45] Date of Patent: May 8, 1990

[54] PHOTOPOLYMERIZABLE COMPOSITION CONTAINING 3,6-DIAMINOFLUORAN COMPOUNDS

[75] Inventors: Sadao Fujikura; Masayuki Iwasaki; Minoru Maeda; Ken Iwakura, all of Shizuoka, Japan

[73] Assignee: Fuji Photo Film Co., Ltd., Kanagawa, Japan

[21] Appl. No.: 425,460

[22] Filed: Oct. 23, 1989

Related U.S. Application Data

[63] Continuation of Ser. No. 126,377, Nov. 30, 1987, abandoned.

[30] Foreign Application Priority Data

Nov. 29, 1986 [JP] Japan ............... 61-284820

[51] Int. Cl.$^5$ ............... G03C 1/68
[52] U.S. Cl. ............... 430/281; 430/288; 430/345; 430/919; 430/924; 522/14; 522/23
[58] Field of Search ............... 430/281, 288, 345, 319, 430/323, 324, 962; 522/14, 23

[56] References Cited

U.S. PATENT DOCUMENTS

| | | | |
|---|---|---|---|
| 3,042,515 | 7/1962 | Wainer | 430/961 |
| 4,343,885 | 8/1982 | Reardon et al. | 430/281 |
| 4,775,656 | 10/1988 | Harada et al. | 430/281 |

FOREIGN PATENT DOCUMENTS 0005380  11/1979  European Pat. Off.

*Primary Examiner*—Jack P. Brammer
*Attorney, Agent, or Firm*—Sughrue, Mion, Zinn, Macpeak & Seas

[57] ABSTRACT

A photopolymerizable composition comprises a polyfunctional monomer, a photopolymerization initiator, an organic halogen compound and a 3,6-diaminofluoran derivative. The 3,6-diaminofluoran has the formula (I):

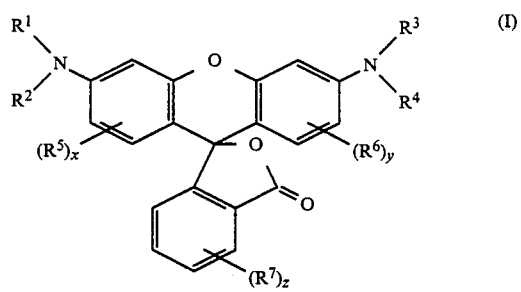

wherein each of $R^1$, $R^2$, $R^3$ and $R^4$ is hydrogen, an alkyl group, a cycloalkyl group, an aralkyl group, an aryl group or a heterocyclic group, $R^1$ and $R^2$ (also $R^3$ and $R^4$ may form a heterocyclic ring in conjunction with the adjoining nitrogen atom, provided that at least two of $R^1$, $R^2$, $R^3$ and $R^4$ are aryl groups, or at least one group of the group containing $R^1$ and $R^2$ and the group containing $R^3$ and $R^4$ forms in conjunction with the adjoining nitrogen atom a heterocyclic ring; each of $R^5$, $R^6$ and $R^7$ is an alkyl group, an alkoxy group, a halogen atom, nitro group, amino group, an alkylamino group, a dialkylamino group or an acylamino group, excluding the case where either one of the 2-position and the 7-position of the derivative is substituted with amino group, an alkylamino group, a dialkylamino group or an acylamino group); each of x and y is an integer of 0 to 3; and z is an integer of 0 to 4.

5 Claims, No Drawings

PHOTOPOLYMERIZABLE COMPOSITION CONTAINING 3,6-DIAMINOFLUORAN COMPOUNDS

This is a continuation, of application Ser. No. 07/126,377, filed Nov. 30, 1987, now abandoned.

BACKGROUND OF THE INVENTION

1. Field of the Invention

This invention relates to a photopolymerizable composition, and more particularly to a photopolymerizable composition giving a color when it is exposed to a light.

2. Description of Prior Art

When a photopolymerizable composition is used in the field of image forming materials such as a photoresist and a photographic paper, it is very convenient that exposed area is visually distinguishable. Such a function is called printing-out or print-out.

Th photosensitive material having the above printout function is advantageously used. In more detail, when a plate-processing operator once stops his exposure operations for simultaneously exposing many photosensitive printing plates and afterwards continues his exposure operations, he is able to visually distinguish which plates are already exposed. Further, when a sheet of a large plate is to be exposed many times as in the photocomposing method in the preparation of lithographic printing plates, operators are able to immediately confirm as to what area is exposed so that failures such as double printing can be prevented.

Accordingly, a printing-out composition or system is incorporated in many photosensitive materials used in photoresist and photosensitive printing plates at present so that an exposed area can be easily distinguished before development.

Examples of the printing-out systems include systems of photo-oxidizing various leuco compounds to the corresponding dyes using an organic polyhalogen compound or other photo-oxidizing agent (see Photo. Sci. Eng., 5, 98-103(19610) and U.S. Pat. No. 3,042,515). These known printing-out systems give printed-out images having excellent contrast, but have a drawback in that there is difficulty in stability in storage.

The use of a combination of a lactone compound and a compound generating an acid by irradiation of light as the printing-out system is disclosed in Japanese Patent Publication No. 49(1974)-6212 and Japanese Patent Provisional Publication Nos. 50(1975)-128228 and 50(1975)-80120. However, a printed-out image obtained in the system is not considered to be satisfactory with respect to contrast. Thus, it is difficult to employ these systems in practice.

Color formers which form a color by action of an acid are described in the literature "Chemistry of Functional Dye", R & D Report No. 13 CMC (1981), pp 189–206.

Other printing-out system is described, for example, in the literature "Light Sensitive Systems", J. Willey and Sons, New York (1955), pp 358–401 (written by J. Kosar, et al.).

Further, many examples of incorporating a printing-out system in a photopolymerization system are known. Examples thereof include leuco color formers described in Japanese Patent Provisional Publication No. 60(1985)-163041 and lactone color formers described in Japanese Patent Provisional Publication Nos. 51(1976)-29137, 52(1977)-130701 and 55(1980)-13780.

However, these known color formers have disadvantages in that their solubility in a solution containing a polymerizable composition is low and the storage stability of solutions containing said known color former and the photopolymerizable composition is poor. Further, the known color formers have problems in that they are apt to lower the sensitivity of the photopolymerizable composition and as a result, the color density obtained after exposure decreases. Accordingly, the known color formers have a problem in practical use together with the photopolymerizable composition.

SUMMARY OF THE INVENTION

It is an object of the present invention to provide a photopolymerizable composition containing a color former which rapidly forms a color having a high contrast against a copper surface and high density after exposure, does not cause lowering in the sensitivity for resist formation and is satisfactorily compatible with the photopolymerizable composition.

It is another object of the invention to provide a photopolymerizable composition which retains substantially the same characteristic as those before storage, even after the polymerizable composition is stored in the form of a solution or a dry film under high-temperature and humid conditions over a long period of time.

The present invention provides a photopolymerizable composition containing a polyfunctional monomer, a photopolymerization initiator, a 3,6-diaminofluoran derivative and an organic halogen compound.

The 3,6-diaminofluoran derivative which can be used in the present invention is a compound having the following formula (I):

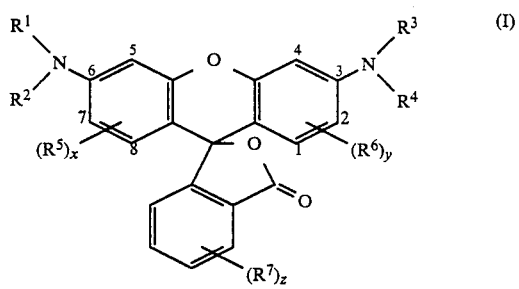

wherein each of $R^1, R^2, R^3$ and $R^4$ is hydrogen, an alkyl group, a cycloalkyl group, an aralkyl group, an aryl group or a heterocyclic group, $R^1$ and $R^2$ (also $R^3$ and $R^4$) may form a heterocyclic ring in conjunction with the adjoining nitrogen atom, provided that at least two of $R^1$, $R^2$, $R^3$ and $R^4$ are aryl groups, or at least one group of the group containing $R^1$ and $R^2$ and the group containing $R^3$ and $R^4$ forms in conjunction with the adjoining nitrogen atom a heterocyclic ring; each of $R^5$, $R^6$ and $R^7$ is an alkyl group, an alkoxy group, a halogen atom, nitro group, amino group, an alkylamino group, a dialkylamino group or an acylamino group, excluding the case where either one of the 2-position and the 7-position of the derivative is substituted with amino group, an alkylamino group, a dialkylamino group or an acylamino group); each of x and y is an integer of 0 to 3; and z is an integer of 0 to 4.

DETAILED DESCRIPTION OF THE INVENTION

The fluoran derivatives having the formula (I) are known compounds and disclosed in, for instance, Japanese Patent Publication No. 49(1974)-28449. Japanese Patent Provisional Publication No. 56(1982)-77189 discloses that these compounds can be used as coloring materials for use in conventional pressure-sensitive recording material, heat-sensitive recording material (thermal recording material) and electrothermal recoding material.

The present inventors have found that the above fluoran derivatives exhibit excellent practical characterisitics, when they are used in the printing-out system together with the photopolymerizable composition. The present invention is made upon this finding.

The 3,6-diaminofluoran derivatives of the formula (I) according to the present invention is favorably used in the printing-out system.

Among the 3,6-diaminofluoran derivatives having the formula (I), the compounds where $R^1$, $R^2$, $R^3$ and $R^4$ are each an aryl group and $R^5$, $R^6$ and $R^7$ are each hydrogen are preferred.

Representative preferred 3,6-diaminofluoran derivatives having the formula (I) where $R^1$, $R^2$, $R^3$ and $R^4$ are each a group described in Table 1 and $R^5$, $R^6$ and $R^7$ are all hydrogens.

TABLE 1

| | $R^1$ | $R^2$ | $R^3$ | $R^4$ |
|---|---|---|---|---|
| 1 | methyl | methyl | phenyl | phenyl |
| 2 | ethyl | ethyl | phenyl | phenyl |
| 3 | methyl | phenyl | methyl | phenyl |
| 4 | ethyl | ethyl | 10-phenothiadizinyl | |
| 5 | ethyl | ethyl | 9-carbazolyl | |
| 6 | phenyl | phenyl | phenyl | phenyl |
| 7 | phenyl | phenyl | p-methylphenyl | p-methylphenyl |
| 8 | phenyl | phenyl | ethyl | p-methylphenyl |
| 9 | phenyl | p-methylphenyl | ethyl | p-methylphenyl |
| 10 | phenyl | p-methylphenyl | phenyl | p-methylphenyl |
| 11 | phenyl | p-chlorophenyl | ethyl | p-chlorophenyl |
| 12 | phenyl | β-naphthyl | ethyl | β-naphthyl |
| 13 | phenyl | β-naphthyl | phenyl | β-naphthyl |
| 14 | p-methylphenyl | p-methylphenyl | p-methylphenyl | p-methylphenyl |
| 15 | phenyl | phenyl | p-methylphenyl | p-methylphenyl |
| 16 | phenyl | m-chlorophenyl | phenyl | m-chlorophenyl |

In the photopolymerizable composition of the present invention, these 3,6-diaminofluoran derivatives may be used either alone or as a mixture of two or more of them.

These compounds as such are known, and methods for the preparation thereof is described in the aforementioned Japanese Patent Provisional Publication No. 56(1981)-77189.

Further, the 3,6-diaminofluoran derivatives of the present invention can be used together with other conventional color former which can form a color by action of an acid.

The organic halogen compound which can be contained in the photopolymerizable composition of the invention is a compound having a function capable of causing the 3,6-diaminofluoran derivative to form a color by the irradiation of light.

Examples of organic halogen compounds having such a function include halogenated hydrocarbons, halogenated alcohol compounds, halogenated carbonyl compounds, halogenated ether compounds, halogenated ester compounds, halogenated amide compounds, and halogenated sulfone compounds.

Examples of the halogenated hydrocarbons include carbon tetrabromide, iodoform, 1,2-dibromoethane, 1,1,2,2-tetrabromoethane, 1,1-bis(p-chlorophenyl)-2,2,2-trichloroethane, 1,2-dibromo-1,1,2-trichloroethane, 1,2,3-tribromopropane, 1-bromo-4-chlorobutane, 1,2,3,4-tetrabromobutane, tetrachlorocyclopropene, hexachlorocyclopentadiene and dibromocyclohexane.

Examples of the halogenated alcohol compounds include 2,2,2-trichloroethanol, tribromoethanol, 1,3-dichloro-2-propanol, 1,1,1-trichloro-2-propanol, di(iodohexamethylene)aminoisopropanol, tribromo-tert-butyl alcohol and 2,2,3-trichlorobutane-1,4-diol.

Examples of the halogenated carbonyl compounds include 1,1-dichloroacetone, 1,3-dichloroacetone, hexachloroacetone, hexabromoacetone, 1,1,3,3-tetrachloroacetone, 1,1,1-trichloroacetone, 3,4-dibromo-2-butanone, 1,4-dichloro-2-butanone and dibromocyclohexanone.

Examples of the halogenated ether compounds include 2-bromoethyl methyl ether, 2-bromoethyl ethyl ether, di(2-bromoethyl) ether and 1,2-dichloroethyl ethyl ether.

Examples of the halogenated ester compounds include esters of halogenated carboxylic acids, halogenated esters of carboxylic acids and halogenated esters of halogenated carboxylic acids. Examples of such esters include bromoethyl acetate, ethyl trichloroacetate, trichloroethyl trichloroacetate, 2,3-dibromopropyl acrylate homopolymer and copolymers, trichloroethyl dibromopropionate and ethyl α,β-dichloroacrylate.

Examples of the halogenated amide compounds include chloroacetamide, bromoacetamide, dichloroacetamide, trichloroacetamide, tribromoacetamide, trichloroethyltrichloroacetamide, 2-bromoisopropionamide, 2,2,2-trichloropropionamide, N-chlorosuccinimide and N-bromosuccinimide.

Examples of the halogenated sulfone compounds include compounds described in U.S. Pat. Nos. 3,042,515 and 3,502,476 and a typical compound is phenyl tribromomethyl sulfone.

Among the halogen compounds, preferred are halogenated compounds where one or more halogen atoms are attached to the same carbon atom, and particularly preferred are those where three halogen atoms are attached to S one carbon atom. These organic halogen compounds may be used either alone or as a mixture of one or more of them.

Typical examples of the polyfunctional monomer which is suitable for use in the photopolymerizable composition of the present invention include polyol acrylates and methacrylates such as diethylene glycol di(meth)acrylate, triethylene glycol di(meth)acrylate, tetraethylene glycol di(meth)acrylate, pentaerythritol tri(meth)acrylate, trimethylolpropane tri(meth)acrylate, dipentaerythritol hexa(meth)acrylate and 1,6-hexanediol(meth)acrylate; bis(meth)acrylamides such as methylenebis(meth)acrylamide and ethylene bis(meth)acrylamide; and polyfunctional monomers having urethane group such as di-(2-methacryloxyethyl)-2,4-tolylenediurethane, di-(2-acryloxyethyl)hexamethylenediurethane and (meth)acrylurethane oligomers obtained by reacting a polyol with a diisocyanate and then reacting the resulting compound having terminal isocyanate group with a β-hydroxyalkyl (meth)acrylate.

These compounds are described in Japanese Patent Publication Nos. 35(1960)-5093, 35(1960)-14719 and 44(1969)-28727.

Preferred examples of the photopolymerization initiator include aromatic ketones such as benzophenone, 4,4'-bis(dimethylamino)benzophenone, 4,4'-bis(diethylamino)benzophenone, 4-methoxy-4'-dimethylaminobenzophenone, 4,4'-dimethoxybenzophenone, 4-dimethylaminobenzophenone 4-dimethylamino acetophenone, anthraquinone, 2-tert-butylanthraquinone, 2-methylanthraquinone, phenanthraquinone, xanthone, thioxathone, 2-chlorothioxanthone, 2,4-dimethylthioxanthone, 2,4-diethylthioxanthone, fluorenone, acridone and benzoin; benzoin ethers such as benzoin methyl ether, benzoin ethyl ether, benzoin propyl ether benzoin isopropyl ether, benzoin phenyl ether and benzyl methyl ketal; 2,4,5-triarylimidazole dimers such as 2-(o-chlorophenyl)-4,5-diphenylimidazole dimer, 2-(o-chlorophenyl)-4,5-di(m-methoxyphenyl)-imidazole dimer, 2-(o-fluorophenyl)-4,5-diphenylimidazole dimer, 2-(o-methoxyphenyl)-4,5-diphenylimidazole dimer and 2-(p-methoxyphenyl)-4,5-diphenylimidazole dimer; polyhalogen compounds such as carbon tetrabromide, phenyl tribromomethyl sulfone and phenyl trichloromethyl ketone; and compounds described in Japanese Patent Provisional Publication No. 53(1978)-133428, Japanese Patent Publication Nos. 57(1982)-1819 and 57(1982))-6096 and U.S. Pat. No. 3,615,455.

These compounds may be used either alone or as a combination of two or more of them. Preferred examples of the combination are a combination of a 2,4,5-triarylimidazole dimer with 2-mercaptobenzoxazole or leuco Crystal Violet, a combination of 4,4'-bis(dimethylamino)benzophenone with benzophenone or benzoin methyl ether described in U.S. Pat. No. 3,427,161, a combination of benzoyl-N-methylnaphthothiazoline with 2,4-bis(trichloromethyl)-6,4n-methoxyphenyl-triazole described in U.S. Pat. No. 4,239,850, and a combination of dimethylthioxanthrone with a 4-dialkyl aminobenzoate described in Japanese Patent Provisional Publication No. 57(1982)-23602.

In the preferred embodiment of the present invention, the photopolymerizable composition contains 99 to 50% by weight of the polyfunctional monomer, 1 to 10% by weight of the photopolymerization initiator, 0.5 to 5% by weight of the 3,6-diaminofluoran derivative and 0.5 to 5% by weight of the organic halogen compound, each amount being calculated on the basis of the combined amount of the polyfunctional monomer, the photopolymerization initiator, the 3,6-diaminofluoran derivative and the organic halogen compound.

The ratio of the polyfunctional monomer to the photopolymerization initiator preferably ranges from 100:1 to 5:1, more preferably from 30:1 to 10:1, by weight.

The ratio of the 3,6-diaminofluoran derivative to the organic halogen compound ranges preferably 5:1 to 1:5, more preferably from 3:1 to 1:3 by weight.

The photopolymerizable composition of the present invention may contain a binder in addition to the essential ingredients of the polyfunctional monomer, the photopolymerization initiator, the 3,6-diaminofluoran derivative and the organic halogen compound.

Examples of the binder which can be contained in the composition of the present invention include synthetic high-molecular compounds such as acrylic resin, styrene resin, polyamide, polyester, polyurethane, polyvinyl alcohol and vinyl ester resin; modified synthetic high-molecular compounds such as polyvinyl formal and polyvinyl butyral; and natural high-molecular compounds such as cellulose and gelatin and modified products thereof.

The binder is used in an amount of 50 to 300% by weight based on the combined amount of the polyfunctional monomer, the photopolymerization initiator, the fluoran derivative and the organic halogen compound.

When the photopolymerizable composition of the present invention is used as a photosensitive material, the polyfunctional monomer, the photopolymerization initiator, the fluoran derivative, the organic halogen compound and optionally the binder are dissolved in a solvent inert to them to prepare a liquid photosensitive composition. A support is then coated with said liquid photosensitive composition to obtain a photosensitive material.

Examples of the solvents which can be used for the preparation of the liquid photosensitive composition include amides such as formamide, N,N-dimethylformamide and N,N-dimethylacetamide: alcohols such as methanol, ethanol, 1-propanol, 2-propanol, butanol, 2-methoxyethanol, 2-ethoxyethanol and 1-methoxy-2-propanol: ketones such as acetone, 2-butanone and cyclohexanone: esters such as ethyl acetate and ethyl benzoate; ethers such as tetrahydrofuran and dioxane; aliphatic chlorinated hydrocarbons such as methylene chloride, ethylene chloride and dichloroethane: aromatic hydrocarbons such as benzene and toluene: other conventional solvents such as dimethyl sulfoxide, o-dichlorobenzene, dicyanodichlorobutane, 1-methyl-2-oxohexamethyleneimine, etc. and mixtures thereof.

When the photopolymerizable composition of the invention is applied to a support and dried, the thickness of the photopolymerizable composition is generally in the range of from about 0.05 to 100 μm. When it is used as photoresist, the thickness is preferably in the range of from 10 to 100 μm. For lithography, the thickness is preferably in the range of from 0.1 to 5.0 μm.

Materials suitable for use as the support can be chosen from among various materials which are chemically inert to the coating composition. Examples of such support materials include fibrous materials such as paper, polyethylene-coated paper, polypropylene-coated papaer, parchment and cloth: metallic sheets or foils such as sheets or foils of aluminum, copper, magnesium and zinc; glass and metal-coated glasses such as chromium, chromium alloy, copper, silver, gold or platinum-coated glass and synthetic resin or polymer films or sheets such as polyacrylic resin film (e.g., polymethyl methacrylate film), polyester film (e.g., polyethylene terephthalate film), polyvinyl acetal film, polyamide file and cellulose ester film (e.g., cellulose nitrate, cellulose acetate, cellulose acetate propionate or cellulose acetate butyrate film).

Support materials suitable for use in the preparation of dry film resist are polyesters and polycarbonates.

Support materials suitable for use in the preparation of printing plate, particularly lithographic plate are paper and metallic supports for printing plate such as zinc, electrolytic aluminum, sand-grained aluminum (surface-roughened aluminum) and copper supports; cellulose ester films having a hydrolyzed surface and polymer supports such as polyolefin, polyester and polyamide.

These supports may be coated with conventional undercoating layer before the coating of the photosensitive composition. Examples of materials for the undercoating layer include copolymers of vinylidene chloride with an acrylic monomer (e.g., acrylonitrile, methyl acrylate, etc.) or an unsaturated dicarboxylic acid such as itaconic acid; carboxymethyl cellulose: gelatin; polyacrylamide; and similar polymers.

The support may be provided with an antihalation layer or a filter layer comprising a colored polymer layer to absorb an exposure radiation having been passed through the radiation-sensitive layer or to prevent reflection.

The support may be coated with the liquid photosensitive composition by any of conventional methods such as geyser coating spray coating, brush coating, roller coating or dip coating or by casting the composition onto the support or immersing the support in the composition.

Thus prepared coated layer is dried at room temperature or by heating to obtain a photosensitive material.

The photosensitive material is exposed to an actinic radiation having a pattern in the form of an image to form an image directly on the support. The exposure can be made from the original having an image by means of contact print or projection, reflection or double reflection with a lens. The exposure operation may be made by other conventional method.

After the exposure of the photosensitive material to a radiation, the photopolymerizable composition of the present invention can be developed by flushing, soaking or swapping the radiation-sensitive layer with a solvent (hereinafter referred to as developing solution) which selectively dissolves the non-exposure area (i.e., unexposed area) of the radiation-sensitive layer, or by other treatments.

The present invention has an advantage in that there is provided a photopolymerizable composition containing a printing-out system which rapidly forms a color having a high contrast with copper and high density after exposure and is well-soluble in solvents.

Further, the photopolymerizable composition of the invention can retain substantially the same characteristics as those before storage, even after it is stored in the form of a solution or a dry film under high-temperature and humid conditions over a long period of time. Accordingly, the photopolymerizable composition of the present invention has high storage stability.

The following example will further illustrate the present invention in more detail.

EXAMPLE

The following photopolymerizable composition solution was prepared. The surface of a polyester film of 25 μm in thickness was then coated with said solution by a bar coater in such a coating amount as to give a dry coated layer of 25 μm in thickness. The coated layer was dried at 120° C. for 5 minutes to prepare a dry film.

The 3,6-diaminofluoran derivatives of the present invention were used as color formers. For the purpose of comparison. the fluoran compounds (compounds II to IV) which are disclosed in Japanese Patent Provisional Publication No. 55(1908)-13780 and Japanese Patent Publication No. 49(1974)-2844 and conventional Crystal Violet Lactone (compound I) were used as color formers.

| High-molecular binder (benzyl methacrylate/methacylic acid/acrylic acid copolymer, molar ratio of 55/20/25, weight-average molecular weight: 140,000) | 15.00 g |
| --- | --- |
| Tetradecaethylene glycol diacrylate | 2.00 g |

| -continued | |
| --- | --- |
| Nonapropylene glycol dimethacrylate | 7.00 g |
| 4,4'-Bis(diethylamino)benzophenone | 0.04 g |
| Benzophenone | 0.45 g |
| Phenyl tribromomethyl sulfone | 0.15 g |
| Victoria Pure Blue BOH | 0.01 g |
| Methyl ethyl ketone | 15.00 g |
| 2-Methoxyethanol | 7.5 g |
| Color former | 0.20 mmol |

The following color formers were used.

Comparison compounds

Compound I (Crystal Violet Lactone):

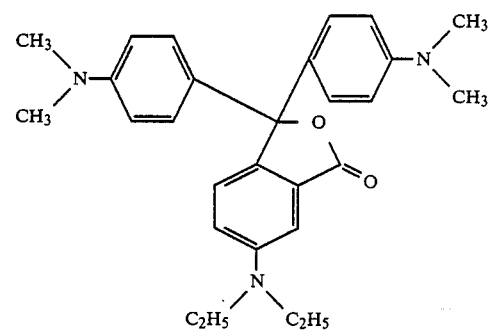

Compound II (fluoran compound for comparison):

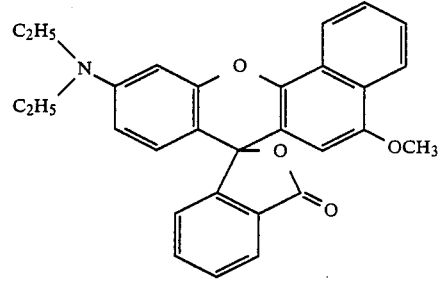

Compound III (floran compound for comparison):

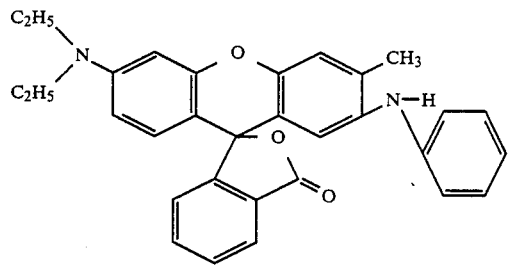

Compound IV (3,6- diaminofloran derivative for comparison):

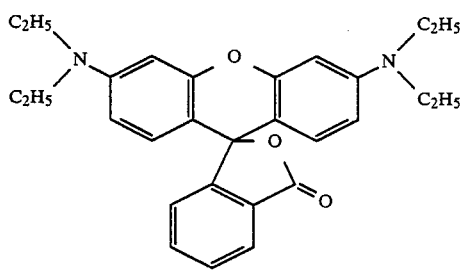

3,6-Diaminofloran derivative according to the present invention:

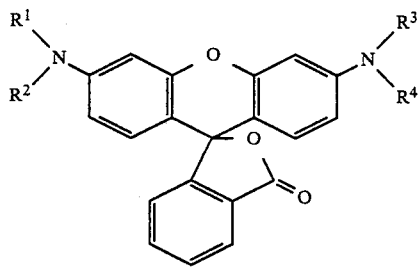

Each of $R^1$, $R^2$, $R^3$ and $R^4$ groups in the above formula is shown in Table 2.

TABLE 2

| Compound | $R^1$ | $R^2$ | $R^3$ | $R^4$ |
|---|---|---|---|---|
| 1 | phenyl | phenyl | phenyl | phenyl |
| 2 | phenyl | methyl | phenyl | methyl |
| 3 | phenyl | β-naphthyl | phenyl | β-naphthyl |
| 4 | p-methylphenyl | p-methylphenyl | p-methylphenyl | p-methylphenyl |
| 5 | phenyl | phenyl | p-methylphenyl | p-methylphenyl |
| 6 | phenyl | p-methylphenyl | phenyl | p-methylphenyl |
| 7 | phenyl | m-chlorophenyl | phenyl | m-chlorophenyl |

The absorbance of the dry film obtained by coating the polyester base (i.e., support) with the photopolymerizable composition and drying it in the above-stated manner, was measured in the unexposed state at each wavelength by means of a spectrophotometer (Shimazu Graphicord UV-340).

The dry film was then exposed (140 mj/cm²) using an ultra-high pressure mercury lamp (HMW-6N, manufactured by ORC). One minute after exposure, the absorbance was measured at each wavelength by means of the above-stated spectrophotometer.

The results are shown in Table 3 wherein λ represents a wavelength at which a difference between both wavelengths (one minute after exposure and the unexposed state) in the visible light region is the greatest and ΔD represents a difference between absorbance at that wavelength.

Further, colors formed after exposure and contrast between exposed area and unexposed area were evaluated by visual observation. The results are shown in Table 3 wherein A represents very superior, B represents superior, C represents slightly inferior and D represents bad.

TABLE 3

| Color Former | Δ D | λ | Contrast of exposed area/ unexposed area | Color |
|---|---|---|---|---|
| Compound I (Comp. Ex.) | 0.01 | 600 | D | light blue |
| Compound II (Comp. Ex.) | 0.16 | 580 | C | light purplish red |
| Compound III (Comp. Ex.) | 0.11 | 600 | B | greenish blue |
| Compound IV (Comp. Ex.) | 0 | — | D | light red |
| 1 (Invention) | 0.12 | 580 | B | blue |
| 2 (Invention) | 0.84 | 560 | A | deep purple |
| 3 (Invention) | 0.11 | 600 | B | blue |
| 4 (Invention) | 0.27 | 590 | A | deep blue |
| 5 (Invention) | 0.28 | 590 | A | deep blue |
| 6 (Invention) | 0.16 | 585 | A | deep blue |
| 7 (Invention) | 0.12 | 570 | B | purple |

It can be seen from the above results that when the color former of the present invention is used as a color former for the printing-out system in the photopolymerizable composition comprising a polyfunctional monomer component and a photopolymerization initiator, there can be obtained an image with a high density and a high contrast as compared with conventional Crystal Violet lactone and known various color formers having a similar structure to that of the color former of the present invention.

The surface of a copper sheet was polished with a nylon brush (#1000), washed with water and dried. The dry film obtained above was bonded to the copper sheet with heating at 110° C. under pressure to obtain a laminate. A photo mask composed of various thin line patterns was placed upon said laminate. The resulting laminate was exposed (140 mj/cm²) by means of the aforementioned mercury lamp. After about 1% minutes, development was made using an aqueous solution of 1% sodium carbonate (30° C.). In this way, samples in which a resist pattern was formed on the copper sheet were prepared. A contrast to the copper sheet was judged by visual observation as to whether the contrast was good or bad.

The fluoran compounds exhibiting blue to deep blue and deep purple color according to the present invention were superior in that their color tone made a high contrast with the redness of copper.

It was surprising that the fluoran compounds 1 to 7 (where at least two of $R^1$, $R^2$, $R^3$ and $R^4$ being an aryl group) according to the present invention had excellent color formability (developability) as compared with the Compound IV for comparison [corresponding to the 3,6-diaminofluoran derivative having the formula (I) where $R^1$, $R^2$, $R^3$ and $R^4$ and each ethyl group], that is, the compound where all substituents are an alkyl group.

Any of the color formers of the present invention was rapidly dissolved in the solvent for the preparation of the solution of the photopolymerizable composition.

The storage stability of the printing-out system was evaluated by placing the photopolymerizable composition solution and the laminate under forced thermal conditions.

The photopolymerizable composition solution was stored at 40° C. for three days and the dry film was stored at 45° C. and at a RH of 74% for three days. A difference between absorbances after and before storage was measured, that is, print-out fog was measured. The polymerizable composition solution was diluted 10 times with chloroform and the measurement was made.

For the purpose of comparison, leuco Crystal Violet (Compound V) having the following formula:

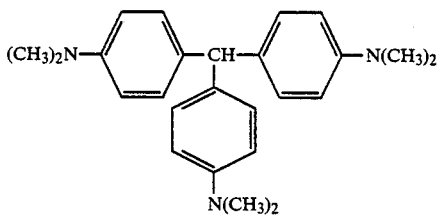

was used as a color former. The polymerizable composition solution having the same composition as that stated above was prepared except that Compound V was used as the color former. A polyester film was coated with the solution and dried to prepare a dry film. A 25 μm thick polyethylene film as a protective film was laminated onto the surface of the dry film to prepare a laminate. In a similar manner to that in the above, the storage stability of the printing-out system was evaluated by placing the photopolymerizable composition solution and the laminate under forced thermal conditions. The results are shown in Table 4.

TABLE 4

| Color former | Printing-out fog | |
| --- | --- | --- |
| | solution | laminate |
| Compound I (Comp. Ex.) | 0.062 | 0.027 |
| Compound II (Comp. Ex.) | 0.080 | 0.032 |
| Compound III (Comp. Ex.) | 0.075 | 0.044 |
| Compound IV (Comp. Ex.) | 0.040 | 0.015 |
| Compound V (Comp. Ex.) | 2.080 | 1.270 |
| Compound 1 (Invention) | 0.023 | 0.018 |
| 2 (Invention) | 0.032 | 0.031 |
| 3 (Invention) | 0.018 | 0.025 |
| 4 (Invention) | 0.010 | 0.041 |
| 5 (Invention) | 0.011 | 0.028 |
| 6 (Invention) | 0.032 | 0.040 |
| 7 (Invention) | 0.009 | 0.015 |

It is apparent from the results that the photopolymerizable composition containing the color former according to the present invention is a printing-out system photopolymerizable composition having excellent storage stability, though the composition exhibits a high print-out density.

The surface of a copper sheet was polished with a nylon brush (#1000), washed with water and dried. The aforementioned dry film was bonded to the copper sheet at 110° C. under pressure. The laminate was left to stand at room temperature for 15 minutes and exposed (140 mj/cm²) through a polyester film and a step wedge having a difference in optical density of 0.15 (Fuji step Guide, 15 steps, manufactured by Fuji Photo Film Co., Ltd.) by means of the above-described ultra-high pressure mercury lamp. After about 15 minutes, the laminate was developed for approx. 50 seconds using an aqueous solution of 1% sodium carbonate (30° C.).

The number of clear steps (sensitivity) of the obtained step wedge image on the surface of the copper sheet was read out to examine the sensitivity of the laminate. The results are shown in Table 5.

TABLE 5

| Color former | Sensitivity |
| --- | --- |
| Compound I (Comp. Ex.) | 10 |
| Compound II (Comp. Ex.) | 10 |
| Compound III (Comp. Ex.) | 9 |
| Compound IV (Comp. Ex.) | 10 |
| No Color former | 10 |
| Compound 1 (Invention) | 10 |
| Compound 2 (Invention) | 10 |
| Compound 3 (Invention) | 10 |
| Compound 4 (Invention) | 10 |
| Compound 5 (Invention) | 10 |
| Compound 6 (Invention) | 10 |
| Compound 7 (Invention) | 10 |

It is apparent from the above results that when the color former of the present invention is used as a color former for the printing-out system in the photopolymerizable composition comprising a polyfunctional monomer component and a photopolymerization initiator, there can be obtained a color with a high density and a high contrast and there is not caused lowering in sensitivity in the formation of resist.

It is clear that when known color former is used as a color former for the printing-out system in the photopolymerizable composition comprising a polyfunctional monomer component and a photopolymerezation initiator, there are problems that the contrast of the exposed area/unexposed area is low (Comparision Examples I, II and IV); the printing-out fog in the solution is high (Comparison Exapmles I, II and III): the printing-out fog in both the solution and the laminate is very high (Comparison Examples V); and sensitivity is low (Comparison Examples IV).

We claim:

1. A photopolymerizable composition consisting essentially of 50–99% by weight of a polyfunctional monomer having a methacrylate or acrylate group, 1–10% by weight of a photopolymerization initiator, 0.5–5% by weight of an organic halogen compound capable of causing a 3,6-diaminofluoran derivative to form a color by the irradiation of light, and 0.5–5% by weight of a 3,6-diaminofluoran derivative having the formula (II):

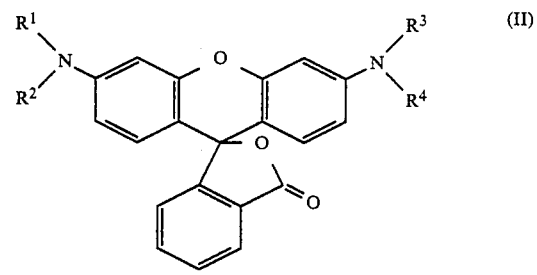

wherein $R^1$, $R^2$, $R^3$ and $R^4$ are the same or different groups and each is phenyl or p-methylphenyl.

2. The photopolymerizable composition as claimed in claim 1, wherein each of $R^1$, $R^2$, $R^3$ and $R^4$ is phenyl.

3. The photopolymerizable composition as claimed in claim 1, wherein each of $R^1$ and $R^2$ is phenyl, and each of $R^3$ and $R^4$ is p-methylphenyl.

4. The photopolymerizable composition as claimed in claim 1, wherein each of $R^1$ and $R^3$ is phenyl, and each of $R^2$ and $R^4$ is p-methylphenyl.

5. The photopolymerizable composition as claimed in claim 1, wherein each of $R^1$, $R^2$, $R^3$ and $R^4$ is p-methylphenyl.

* * * * *